United States Patent
Garcia et al.

(10) Patent No.: US 6,194,679 B1
(45) Date of Patent: Feb. 27, 2001

(54) FOUR ELECTRICAL CONTACT TESTING MACHINE FOR MINIATURE INDUCTORS AND PROCESS OF USING

(76) Inventors: Douglas J. Garcia, 11495 Alps Way, Escondido, CA (US) 92026; Jakob Herrmann, 10616 E. Michigan Ave., Sun Lakes, AZ (US) 85248

( * ) Notice: Subject to any disclaimer, the term of this patent is extended or adjusted under 35 U.S.C. 154(b) by 0 days.

(21) Appl. No.: 09/370,083

(22) Filed: Aug. 6, 1999

(51) Int. Cl.[7] .................................................. B07C 5/344
(52) U.S. Cl. .......................... 209/571; 209/573; 209/574; 209/600; 209/601; 324/754; 324/546; 324/758
(58) Field of Search .................................... 209/571, 573, 209/574, 600, 601, 602, 604, 575; 324/754, 546, 758

(56) References Cited

U.S. PATENT DOCUMENTS

| | | | |
|---|---|---|---|
| 3,537,580 | * 11/1970 | Beroset et al. | 209/73 |
| 3,930,993 | * 1/1976 | Best et al. | 209/73 |
| 4,436,619 | * 3/1984 | Petrov et al. | 209/573 |
| 4,500,003 | * 2/1985 | Cedrone | 209/573 |
| 4,747,479 | * 5/1988 | Herrman | 198/345 |
| 4,790,438 | * 12/1988 | Wilhelm et al. | 209/573 |
| 4,818,382 | * 4/1989 | Anderson et al. | 209/573 |
| 4,978,913 | * 12/1990 | Hamuro et al. | 324/158 |
| 5,034,749 | * 7/1991 | Jungblut et al. | 324/158 |
| 5,042,668 | * 8/1991 | Hunt et al. | 209/539 |
| 5,131,206 | * 7/1992 | Sillner | 53/54 |
| 5,568,870 | * 10/1996 | Utech | 209/573 |
| 5,739,696 | * 4/1998 | Herrmann et al. | 324/754 |
| 5,842,579 | * 12/1998 | Garcia et al. | 209/573 |
| 6,040,705 | * 3/2000 | Garcia et al. | 324/762 |

* cited by examiner

Primary Examiner—Donald P. Walsh
Assistant Examiner—Jonathan R. Miller
(74) Attorney, Agent, or Firm—John J. Murphey

(57) ABSTRACT

In a machine for testing and sorting miniature electrical inductors of the type having spaced-apart, opposed first and second metal-terminated ends, wherein the machine includes a feed station having an inlet, an outlet and adapted to receive bulk quantities of inductors, a rotatably mounted transport wheel the wheel having an outer rim portion that includes a plurality of separate, spaced-apart compartments adapted to receive inductors from the feed station whereby each of the compartments has a central axis that is oriented perpendicular to the axis of the wheel, a test station including testing apparatus, and a sorting station operatively connected to the testing apparatus whereby an electrical inductor that is within the sorting station can be directed by a transfer means into one of at least two receiving means based on the testing performed at the test station, wherein when an electrical inductor is located in one of the compartments of the wheel. The inductor is transported from the feed station to the test station and then to the sorting station while remaining in the compartments, the improvement in the ability to test the inductor using four separate electrical contacts simultaneously comprising a fixed first electrical contact and a second electrical contact, the second electrical contact moveable in a direction toward and away from the wheel, the first and the second electrical contacts in side-by-side, spaced-apart, arrangement in the test station and configured to contact the metal-terminated first end of the electrical inductor, and third and fourth electrical contacts, each of the third and fourth contacts moveable in a direction toward and away from the wheel for contacting the metal-terminated second end of the electrical inductor, the first, second, third and fourth electrical contacts arranged to contact the metal-terminated first and second ends of the electrical inductor simultaneously so that electrical tests can be performed on the inductors using all four electrical contacts.

8 Claims, 6 Drawing Sheets

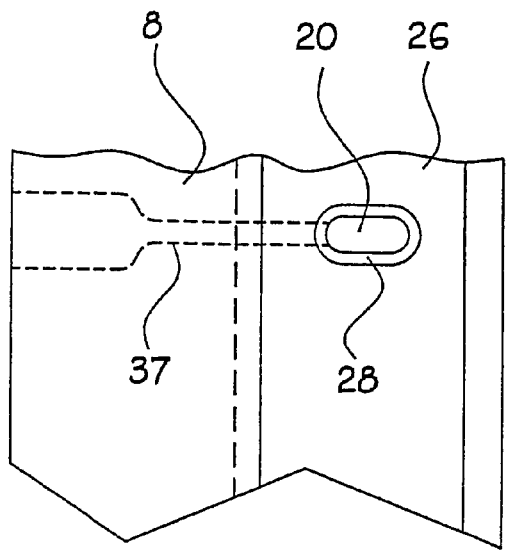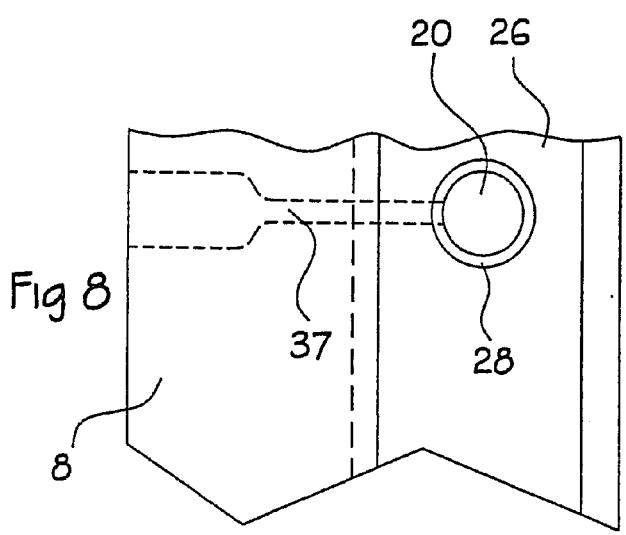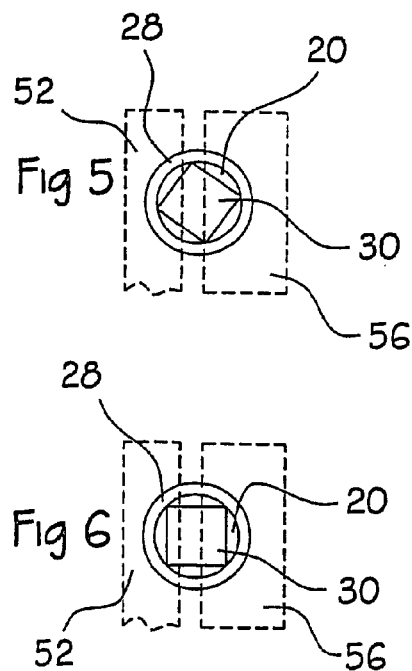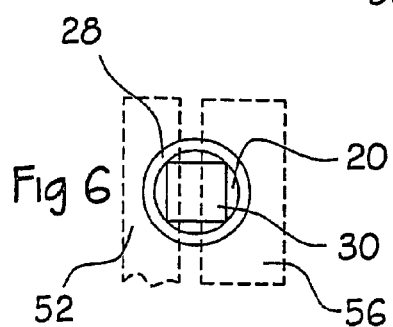

FOUR ELECTRICAL CONTACT TESTING MACHINE FOR MINIATURE INDUCTORS AND PROCESS OF USING

BACKGROUND OF THE INVENTION

1. Field of the Invention

This invention pertains to the field of equipment used for testing and sorting small electronic components. More particularly, the invention is an improvement of the invention disclosed and claimed in U.S. Pat. No. 5,568,870. In that patent, the metal-terminated ends of the miniature electronic ceramic components are loaded in isolated compartments, and each of their terminated ends contacted with a pair of single electrical probes. This invention permits each metal-terminated end of the miniature inductor chip to be simultaneously contacted with two pairs of independent electrical probes. In addition, this invention permits these miniature inductors to be loaded, tested and sorted at processing rates exceeding 60,000 parts per hour.

2. Description of the Prior Art

As we close out the Century, the electronic industry continues its ever speedier race to develop new, smaller and faster-working electronic products. Computers are becoming an increasingly used product in our daily lives. They are being made smaller, more powerful, and to perform more tasks than were ever imagined just a few years ago. While large computers performed mathematical calculations in the '70's and 80', smaller versions of them find increasingly diverse uses, today such as connecting many people through portable cellular telephones, controlling vehicular traffic flow, telling and monitoring time for everything from sleeping to cooking, and now even monitoring the real-time location of parents and children alike.

While more uses are being found for computers, developments come about only by shrinking computer components so that the overall product is more consumer friendly. Accordingly, there is constant pressure to reduce the size of electronic circuit components to allow computers and processors to be made smaller and smaller. As an example, the ageold inductor has shrunk from a cigarette-sized coil with wires extending from the ends thereof to a tiny ceramic device, far smaller than a grain of rice with metal terminations at the ends thereof. The metal terminations take the place of the end termination wires so that the inductor can be soldiered directly to minute parallel copper strips or pads formed on the surface of a circuit board. At the present time, these inductors have been reduced in size to a miniature device having overall dimensions of 0.040×0.024×0.024 inches. Forty-two of them can be set side-by-side within the length of one inch.

In addition to the pressure to make these inductors smaller, there is similar pressure to process, i.e., test and sort them faster. In processing these miniature inductors, it is important to contact each metallic terminated end of the inductor simultaneously with at least two conductors and also to accomplish this task quite rapidly and accurately so that the testing and handling time is reduced to a bare minimum. A reduction in processing time allows more such inductors to be processed on a single machine in a certain time-period thereby reducing capital expenditures necessary for testing equipment and labor costs involved in handling the testing itself. Rapid processing rates, for inductors requiring simultaneous contacting of the ends of the inductor with two pair of electrodes, have been almost impossible because of the difficulty in holding the inductor steady while the four independent conductors approach, contact, and withdraw from the terminated ends of the inductor.

The greatest problem in performing high-speed testing of such miniature parts is in handling them. As they get smaller, they become more difficult to handle and surface tension, static electricity, moisture on a person's hands, humidity, and ambient temperature begin to play an ever-increasing role in preventing smooth operation. In addition, the market is calling for faster handling of the inductors in order to maintain, or in some cases, drive down the cost of providing them to the industry. Competition is fierce and technical achievement is becoming paramount in maintaining market penetration.

SUMMARY OF THE INVENTION

This invention is an improvement of the device for testing and sorting small electronic components disclosed and claimed in U.S. Pat. No. 5,568,870. In that patent, a single electrical probe was brought into contact with each of the opposed metal-terminated ends of the electrical component to perform certain electrical tests before the compartment carrying the chip was advanced to a new position where the tested chip was off-loaded into a bin.

With respect to certain electrical components, such as miniature ceramic inductors, there is a need to contact each terminated end of the inductor with two, spaced-apart electrical probes and a further requirement that all four probes, that is two on the top metal-terminated end and two on the bottom terminated end, be done simultaneously. The device shown in U.S. Pat. No. 5,568,870 cannot perform this function and it is to the inventive changes brought to this machine that this patent is directed. The machine of this invention is also for high-speed electrical testing of miniature metal-terminated electronic inductors but this time through simultaneous contact with four electric contacts instead of two contacts. While the machine may look overall like the one shown in the aforesaid patent, the testing station is totally different. The machine of this invention comprises a feed station, a rotatably mounted transport wheel where the outer rim portion includes a plurality of separate, spaced-apart compartments adapted to receive miniature electrical inductors from the feed station, a test station, and a sorting station. Further included is a first element having formed therein a plurality of individual bores, each with their main axis in parallel, spaced-apart arrangement along a path, the bores of a diameter and length for loading one inductor in each bore under the influence of gravity and arranged to retain the loaded inductors therein with their metal-terminated ends in upper and lower facing arrangement parallel to the axis of each bore. A first electrically-conductive support surface is in contact with less than the complete lower facing metal-terminated end for aid in retaining the inductor in the bore. A first device is provided for passing the inductor over the first electrically-conductive support surface while simultaneously passing the same end of the inductor over and in contact with a second electrically-conductive, non-supportive surface spaced-apart from the first electrically-conductive support surface. A second device is provided for passing the inductor under and in contact with third and fourth electrically-conductive spaced-apart, non-support surfaces simultaneously with contacting the inductor with the first and second electrically-conductive support surfaces for beginning electrical tests on the inductors only while each inductor is in electrical contact with the first, second, third and fourth electrical conductors. A third device is provided for tracking the results of the electronic tests for each inductor and the position of the tracked inductor as it leaves contact with the third and fourth surfaces. Finally there is a fourth device provided for selectively extracting the inductors from the bores according to at least one of the results of the electrical testing and for joining together inductors of those desired test results.

Other features of the invention include the ability to handle and visually inspect one of the smallest components, known in the industry as an inductor chip, having external dimensions as small as 0.040×0.024×0.024 inches; the ability to handle throughputs as high as 60,000 parts per hour, moving these small inductors delicately so that handling by the machine does not result in surface damage to the inductors, and very safely and efficiently insuring only electrically acceptable inductors reach the "good" bin.

Accordingly, the main object of this invention is a machine which performs fast and safe testing and sorting of these miniature ceramic inductors at high throughput rates using delicate techniques, to insure they will not be degraded through handling. Other objects of this invention include a machine which provides simultaneous contact with four, electrodes, two on each metal-terminated end of the inductor and each electrode spaced-apart from the other so that true electrical tests can be conducted on each inductor.

These and other objects of the invention may be determined by reading the description of the preferred embodiments along with the drawings attached hereto. The scope of protection sought by the inventor may be gleaned from a fair reading of the claims that conclude this specification.

DESCRIPTION OF THE DRAWINGS

FIG. 5 is a top view of the bore shown in FIG. 3;

FIG. 6 is a top view of the bore shown in FIG. 3 where the inductor is in a different orientation;

FIG. 7 is a top view of a portion of the rim showing an oblong cross-section;

FIG. 8 is a top view of a portion of the rim showing a square cross-section;

DESCRIPTION OF THE PREFERRED EMBODIMENT

Figure 1:
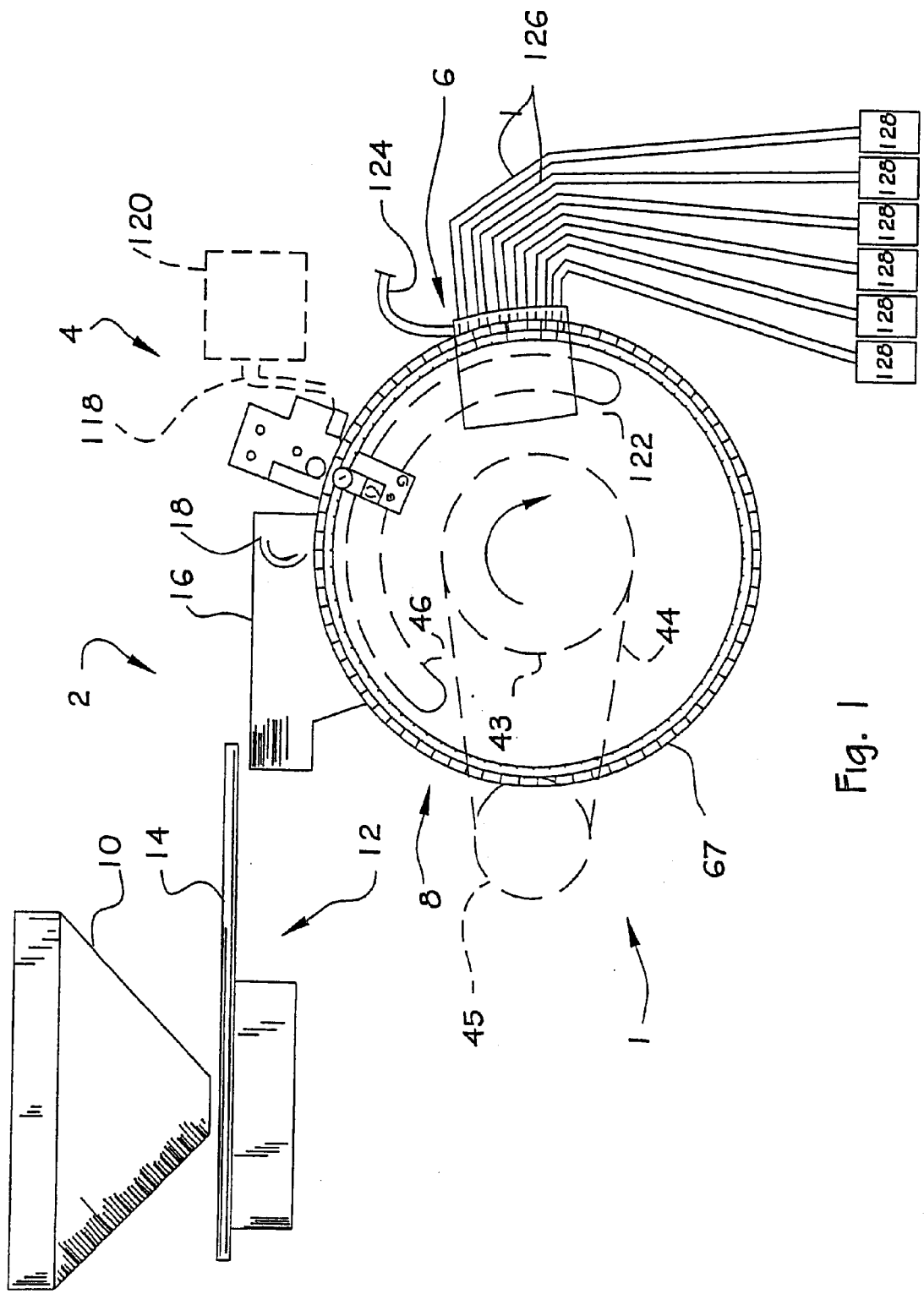
FIG. 1 is a front view of a component testing and sorting machine in accordance with the invention.
Figure 2:
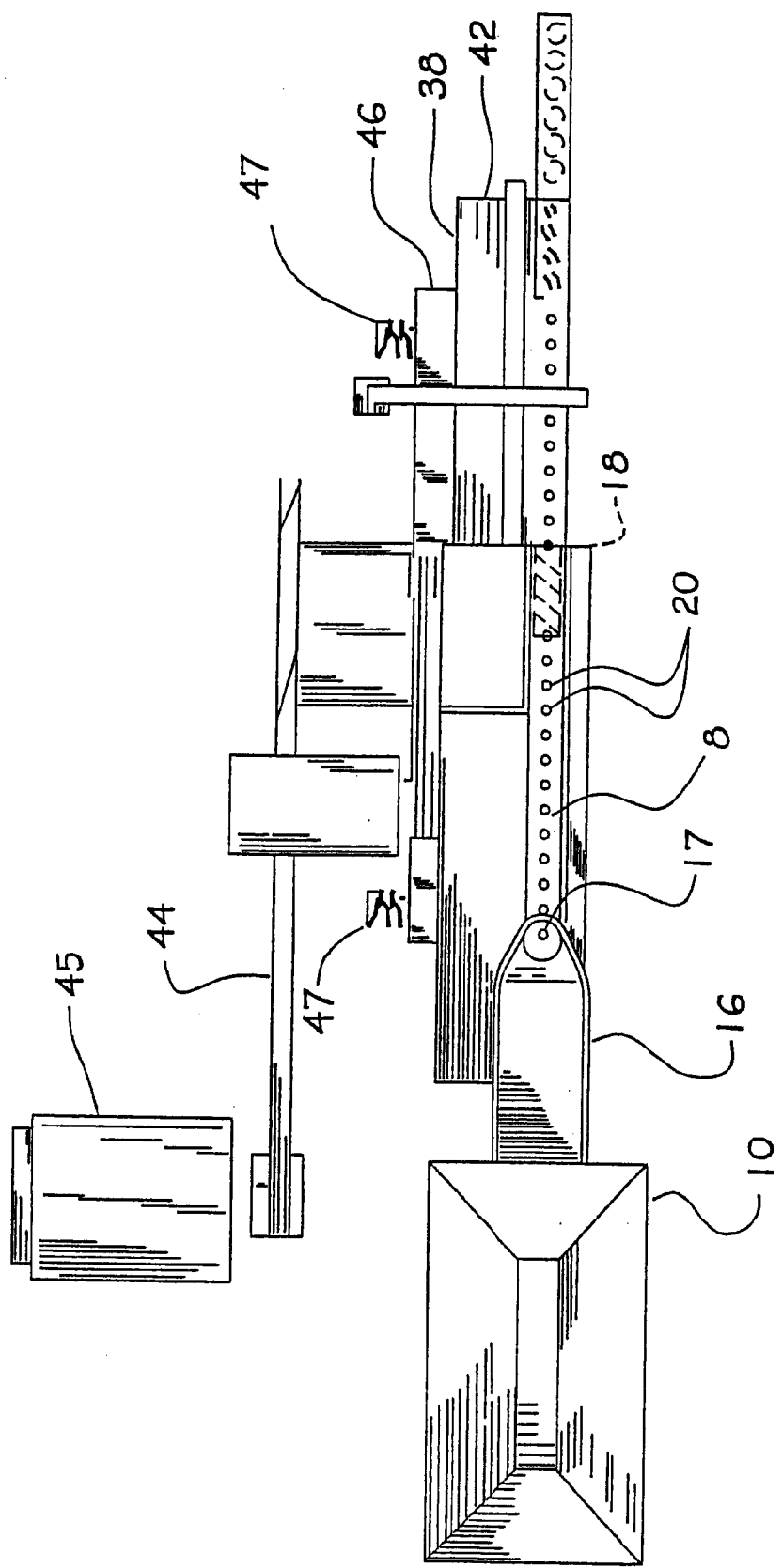
FIG. 2 is a top view of the machine shown in FIG. 1.

Turning now to the drawings wherein elements are identified with numerals and like elements are identified with like numerals throughout the ten figures, FIGS. 1 and 2 depict the improved machine 1 of this invention and show a device for testing and sorting miniature electronic inductors (parts). Machine 1 includes a feed station 2, a test station 4, a sorting station 6 and a transport wheel 8. In the preferred embodiment, each of the stations and the transport wheel are all combined in a single cabinet-style unit.

Feed station 2 includes a funnel-like hopper 10 into which miniature electric inductors are inputted in bulk quantities. Hopper 10 empties into a transfer apparatus 12 that includes a vibrating unit (not shown) that facilitates separation of the inductors and their movement along a ramp 14. Ramp 14 empties into a dispenser 16 that is designed to hold a relatively small number of inductors. Once in the dispenser, the parts may exit it through an outlet 17 formed by an opening in its bottom portion. As inductors leave the dispenser, they are directly received by the transport wheel 8. It should be noted that the dispenser includes a sweeper wheel 18 that continually rotates in an opposite direction from that of transport wheel 8. Sweeper wheel 18 functions to prevent the parts from escaping from the end of the dispenser and also helps to maintain the parts toward the left side portion of the dispenser.

FIG. 2 provides a top view of the machine. In this view, the relationship between feed station 2 and transport wheel 8 may be clearly viewed. When an inductor leaves dispenser 16, it is received within a tubular, complementary-sized compartment 20 located on the outer rim of transport wheel 8. As can be seen, the centerline of the dispenser outlet matches the center of the line of compartments 20 located on transport wheel 8.

Figure 3:
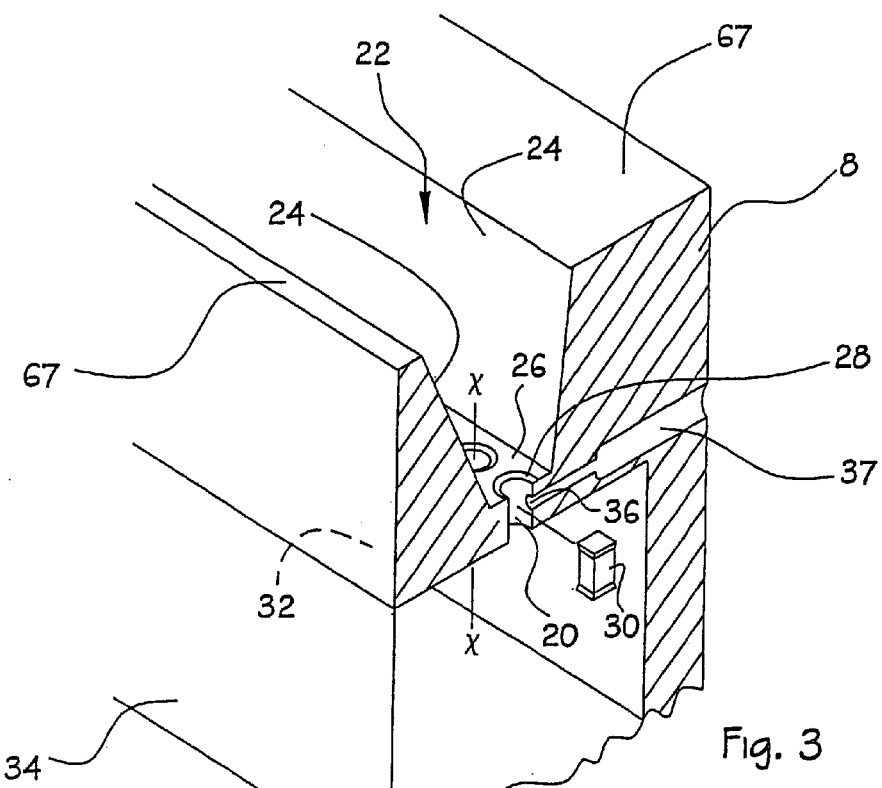
FIG. 3 is an isometric view, partially in section, of the outer portion of the rim of the transport wheel of this invention showing a bore for receipt therein of an inductor having a square cross-section.
Figure 4:
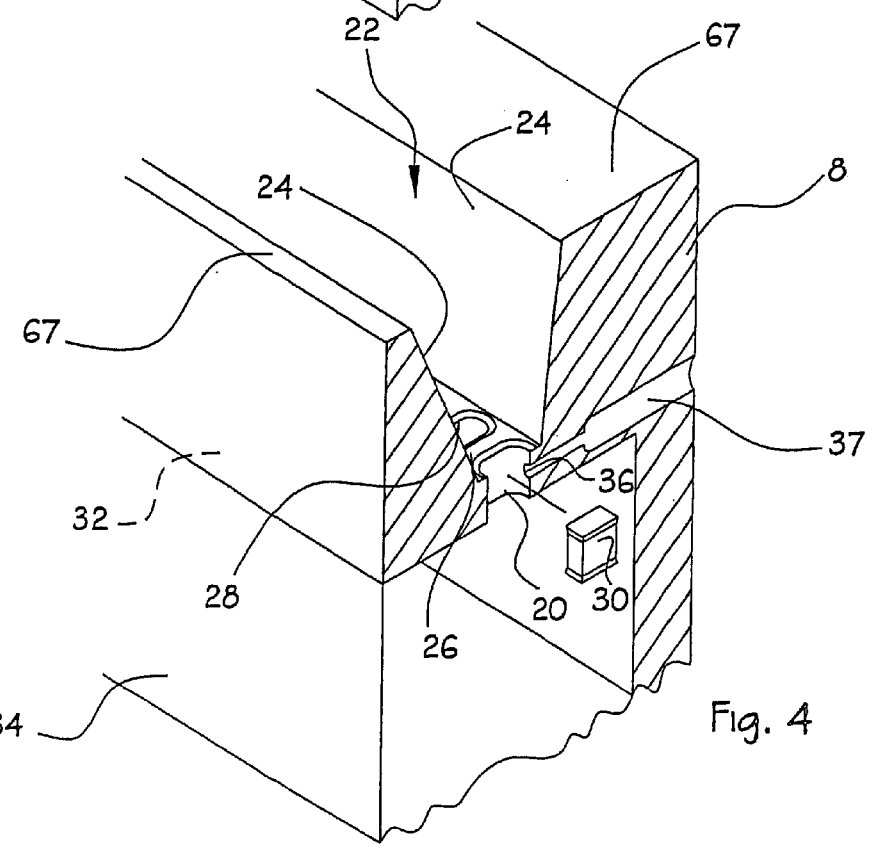
FIG. 4 is an isometric view, partially in section, of the outer portion of the rim of the transport wheel of this invention showing a bore for receipt therein of an inductor having an oblong cross-section.

FIGS. 3 and 4 show a perspective view of the outer part of transport wheel 8. A slot 22 is formed in the outer rim of transport wheel 8 whose major plane is parallel to the plane of wheel 8. Slot 8 is preferably defined by spaced-apart, inwardly sloping slot side walls 24 and a thin slot bottom wall 26. Compartments 20 are formed in bottom wall 26 each having a central axis "x—x" that is oriented perpendicular to the axis of transport wheel 8. As shown in FIGS. 3–8, each compartment is headed by a chamfer 28 to encourage and assist entrance therein of the inductor 30. Where inductors 30 have square cross-sections, such as shown in FIGS. 3, 5 and 6, compartment 20 is made circular so as to accept the inductor therein, in any orientation, as long as the metal terminated ends thereof are at the top and bottom of the compartment. Where inductors 30 have elongated cross-sections, such as shown in FIGS. 4 and 7, compartments 20 are made elongated so as to accept the inductor therein in an orientation that provides the broadest span of the metal-terminated end transverse to the plane of transport wheel 8 to allow the broadest area of contact between the electrical contacts and the terminated ends of the inductor. Beneath the bottom surface of bottom wall 26 lies the periphery or upper surface 32 of a contact ring 34 as shown in phantom outline in FIGS. 3 and 4. Upper ring surface 32 is made of a dielectric and helps support inductors 30 after they are introduced into compartments 20.

Figure 9:
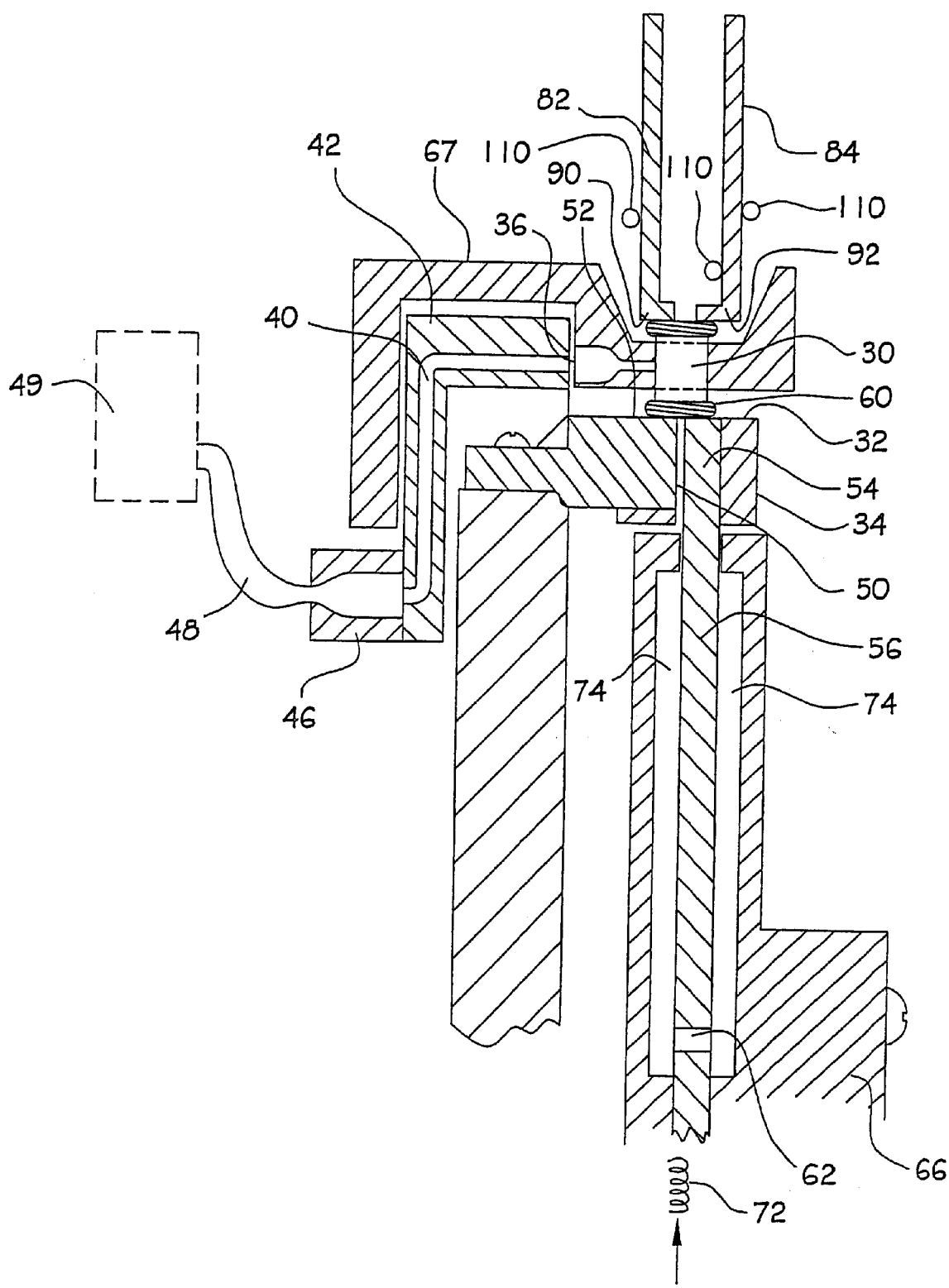
FIG. 9 is a sectional side view of the transport wheel at the test station taken along lines 9—9 in FIG. 10; and, FIG. 10 is an isometric view of the testing station of this invention.

As shown in FIGS. 3 and 4, each compartment 20 of transport wheel 8 has a port 36 that is connected by a small passageway 37 to the rear face of wheel 8. FIG. 9 shows how the port 36 is continuous with a complementary passage 40 in a hub member 42. Passage 40 is operatively connected to a channel-like, curved vacuum supply fitting 44 that is in continuous contact with the rear surface of wheel 8 as shown in FIG. 2. Hub member has a pulley 43 (shown in FIG. 1) fixed to its rear surface that is connected by belt 44 to an electric motor 45. Since transport wheel 8 rotates during operation, springs 47 are used to continually press stationary fitting 46 against the rear surface of transport wheel 8. To reduce friction, fitting 46 is manufactured from a low-friction plastic material. The fitting is connected by a tube 48 to the vacuum source 49. Vacuum pressure from vacuum source 49 aids in retaining inductor 30 in compartment 20 while the bottom metal-terminated end of the inductor rests on contact ring upper surface 32.

Transport wheel is preferably about 18 inches in diameter and is driven by a stepper motor (not shown) that moves the wheel in angular increments, with a slight pause at the end of each increment, so that inductor 30 is carried from feed station 2 to test station 4 in angular steps. Various portions of test station 4 are shown in FIGS. 9 and 10.

Figure 10:
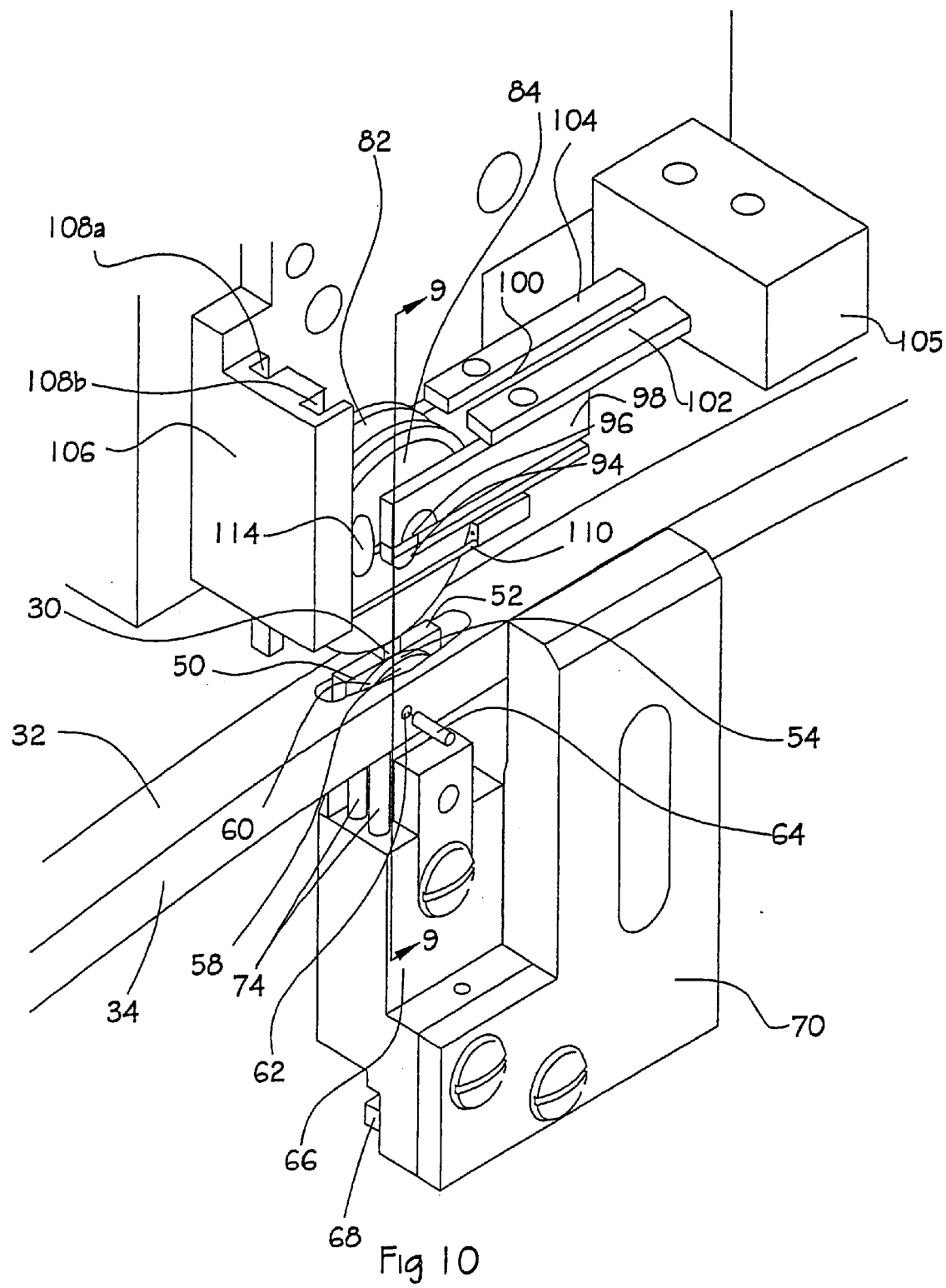

As shown in FIGS. 9 and 10, when coming toward test station 4, inductor 30 first engages elongated dielectric upper contact ring surface 32 that provides fixed support to inductor 30. As it enters test station 4, inductor 30 moves from ring surface 32 to a first, fixed electrical contact 50 along its upper surface 52. Preferably, upper surface 52 is at the same height and contains a smooth electrical conducting surface so that the bottom metal-terminated end of inductor 30 slides effortlessly from surface 32 to surface 50. As shown in FIGS. 5 and 6, first, fix electrical contact 50 will contact inductor lower metal-terminated end no matter what orientation of inductor 30 in compartment 20.

As inductor 30 is moved in compartment 20 onto the upper surface 52 of first, fixed electrical contact 50, it also encounters a second electrical contact 54. Second electrical contact 54 comprises a first roller 56 including a roller body 58 defined by a circular rim 60 and having an aperture 62 formed centrally in roller body 58. An axle 64 (see FIG. 10) of terminal length is provided for pivotal receipt in aperture 62. An adjustable axle plate 66 is provided and slidingly mounted in a lower insulator 68 located below electrical contact 54 and includes a lower mounting bracket 70 that is mounted to the cabinet. Axle plate 66 is adjustable toward and away from the outer rim 67 of transport wheel 8 to insure that roller rim 60 is mounted precisely to engage the lower, metal-terminated end of inductor 30 when it moves across first electrical contact upper surface 52 to effect two electrical contacts with that end of inductor 30. A spring 72 is shown in FIG. 9 below axle plate 66 to provide upward bias pressure on roller 56 to insure a good electrical contact with the metal-termination end of inductor 30. One or more elongated guide rods 74 are provided, each pivotally mounted on an elongated axle rod for contact with roller 56 to control the plane of rotation of roller 56 and to maintain spaced-apart separation of roller 56 from first fixed electrical contact 50. While roller 56 is shown in FIG. 9 in a completely vertical position and directly under one portion of metal-terminated end of inductor 30, it may be angled to one side or the other to provide clearance from first fixed electrical contact 50 when needed.

At the same instant inductor 30 enters test station 4 and encounters first and second electrical contacts, it also encounters third and fourth electrical contacts as shown in FIGS. 9 and 10. Third and fourth electrical contacts each comprise second and third independent rollers 82 and 84, respectively, arranged in side-by-side, spaced-apart configuration, each said roller including a roller body wherein each said roller body is defined by a circular rim 90 and 92 respectively, and each roller body having an aperture (only one shown) 94 formed centrally therein. A short separate axle (only one is shown) 96 of terminal length is provided for pivotal receipt in each said aperture. A pair of axle brackets 98 and 100 are provided in spaced-apart arrangement on each side of said rollers for mounting the terminal ends of the short axle therein. A spring arm 102 and 104 is provided, one attached at one end to axle bracket pair 98 and the other attached at one end to axle bracket pair 100 to provide bias pressure to each roller 82 and 84 respectively. Each said arm is attached at its other end to an insulator block 105 for positioning said rollers in simultaneous, spaced-apart electrical contact with the upper metal-terminated end of inductor 30. Each contact end is moveable on spring arms 102 and 104 in a direction toward and away from transport wheel rim 67 to contact the metal-terminated second end of the electrical inductor. As shown in FIGS. 9 and 10, first, second, third and fourth electrical contacts are arranged by the axles, arms and springs, to contact the metal-terminated first and second ends of electrical inductor 30 simultaneously so that electrical tests can be performed on the inductor using all four electrical contacts.

To insure that second and third rollers 82 and 84 contact the top metal-terminated end of inductor 30 while it is in test station 4, a guide holder 106 is provided having a pair of spaced-apart guide slots 108a and 108b formed therein, each said guide slot having a width slightly wider than the width of the rim of one of the rollers and having a depth sufficient to accept therein a portion of the roller rim to guide the roller rims during rotation thereof in spaced-apart arrangement while in contact with the second end of inductor 30. While rollers 82 and 84 are shown in FIG. 10 in near vertical orientation it may be necessary to angle one or both rollers to one side or the other, or outward, in a "V" shape to provide clearance from each other.

Further included in this improvement is at least one guide rod 110 per roller pivotally mounted on an elongated axle for contact with one rollers 82 or 84 to control the plane of rotation of the rollers and to maintain spaced-apart separation of roller 82 from roller 84. It is preferred that guide rods 110 be placed on both sides of each roller 82 and 84 to accurately control the plane of rotation thereof.

At least one guide ball 114 is pivotally mounted in a holder (not shown) for contact with one or more rollers to assist in controlling the plane of rotation, to reduce vibration of the roller, and to maintain the spaced-apart separation between the rollers. Bias pressure is provided for second, third and fourth electrical contacts in the form of springs, either of the coil variety or of the spring-arm variety. The bias pressure is precisely adjusted so that inductor 30 is pressed against first fixed electrical contact upper surface 50 while insuring sufficient pressure of rollers 56, 82 and 84 against the metal-terminated ends to make positive electrical contact for good testing. Bias pressures on the order of 60 to 80 grams mass are used in this regard.

Upon contact with upper and lower metal-terminated ends of inductor 30, electrical tests are performed. Each of the four electrical contacts is connected by separate wires 118 (shown symbolically in FIG. 10) to a testing apparatus or instrument 120.

After the testing has been completed, rotation of transport wheel 8 brings inductors 30 to sorting station 6. This station includes a block 118 that houses a series of electrically operated solenoid valves (not shown). In the preferred embodiment, each valve is connected to a source 124 of pressurized air and is located so that it points to one of the compartments 20 facing the block. Aligned with compartments 20 and the valves are a plurality of tubes 126, each tube being specific to one of compartments 20 and extending to its own dedicated part-receiving bin 128.

After a part has been tested at test station 4, its test results are temporarily stored by testing instrument 120. Testing instrument 120 is operatively connected to the solenoid valves so that, based on the test results determined at test station 120, when an inductor 30 reaches an appropriate position, it will be aligned with a particular one of the valves. The valve is signaled to open by test instrument 120 and pressurized air is then directed from the valve into compartment 20 that is adjacent to the valve. This forces the inductor 30 in that compartment to be pushed outward into the adjacent tube 126 and thereby into the appropriate receiving bin 128.

While the invention has been described with reference to a particular embodiment thereof, those skilled in the art will be able to make various modifications to the described embodiment of the invention without departing from the true spirit and scope thereof. It is intended that all combinations of elements and steps which perform substantially the same function in substantially the same way to achieve substantially the same result are within the scope of this invention.

What is claimed is:

1. In a machine for testing and sorting miniature electrical inductors of the type having spaced-apart, opposed first and second metal-terminated ends, wherein the machine includes a feed station having an inlet, an outlet and is adapted to receive bulk quantities of inductors, a rotatably mounted transport wheel said wheel having an outer rim portion that includes a plurality of separate, spaced-apart compartments adapted to receive inductors from the feed station whereby each of the compartments has a central axis that is oriented perpendicular to the axis of the wheel, a test station including testing apparatus, and a sorting station operatively connected to the testing apparatus whereby an electrical inductor that is within the sorting station can be directed by a transfer means into one of as least two receiving means based on the testing performed at the test station, wherein when an electrical inductor is located in one of the compartments of the wheel, it is transported from the feed station to the test station and then to the sorting station while remaining in the compartments, the improvement in the ability to test the inductor using four separate electrical contacts simultaneously comprising:

a) a first fixed electrical contact and a second electrical contact, said second electrical contact moveable in a direction toward and away from the wheel, said first and said second electrical contacts in side-by-side, spaced-apart, arrangement in the test station and configured to contact the metal-terminated first end of the electrical inductor, wherein said fixed first electrical contact comprises an elongated surface that provides fixed support to the inductor while it is in the test station and wherein said elongated surface of said fixed first electrical contact is preceded by a dielectric surface over which the first metal-terminated end of the inductor is moved before entering the testing station; and, b) third and fourth electrical contacts, each said contact moveable in a direction toward and away from the wheel for contacting the metal-terminated second end of the electrical inductor;

c) said first, second, third and fourth electrical contacts arranged to contact the metal-terminated first and second ends of the electrical inductor simultaneously so that electrical tests can be performed on the inductors using all four electrical contacts.

2. The improvement of claim 1 wherein said second electrical contact comprises:

a) a first roller including a roller body defined by a circular rim and having an aperture formed centrally in said roller body;

b) an axle of terminal length for pivotal receipt in said aperture;

c) an adjustable axle plate located below said electrical contact and means formed therein for mounting said axle therein to pivotally support said roller in precise location below said wheel; and, d) bias means in contact with said axle plate for applying bias pressure to said roller to insure positive electrical contact against the first metal-terminated end of the inductor.

3. The improvement of claim 2 further including at least one guide rod pivotally mounted on an elongated axle for contact with said roller to control the angle of rotation of said roller and to maintain spaced-apart separation of said roller from said fixed first electrical contact.

4. The improvement of claim 1 wherein said third and fourth electrical contacts comprise:

a) second and third independent rollers in side-by-side, spaced-apart arrangement, each said roller including a roller body defined by a circular rim and having an aperture formed centrally in said roller body;

b) a separate axle of terminal length for pivotal receipt in each said aperture;

c) a pair of axle brackets in spaced-apart arrangement, one on each side of a said roller for mounting therein the terminal ends of said axle; and, d) a spring arm for providing bias pressure to each said roller, each said arm defined by first and second spaced-apart ends, said first end attached to one pair of each said axle brackets and said second end mounted in an insulator block for positioning said rollers for contact with said second end of the inductor.

5. The improvement of claim 4 further including a guide holder for said second and third independent rollers wherein said guide holder has a pair of spaced-apart guide slots formed therein, each said guide slot having a width slightly wider than the width of said rim of one of said rollers and having a depth sufficient to accept therein a portion of said roller rim to guide said roller rims during rotation thereof in spaced-apart arrangement while in contact with said second end of the inductor.

6. The improvement of claim 5 further including at least one guide rod pivotally mounted on an elongated axle for contact with one of said rollers to control the plane of rotation of said roller and to maintain spaced-apart separation of said roller from said other roller.

7. The improvement of claim 5 further including at least one guide ball pivotally mounted on an axle for contact with one of said rollers to control the plane of rotation of said roller and to maintain the spaced-apart separation between said roller and the other said roller.

8. The improvement of claim 7 wherein said rollers are positioned at an angle to each other in order to contact the metal-terminated end of the inductor.

* * * * *

UNITED STATES PATENT AND TRADEMARK OFFICE
CERTIFICATE OF CORRECTION

PATENT NO. : 6,194,679 B1
DATED : February 27, 2001
INVENTOR(S) Garcia et al.

It is certified that error appears in the above-identified patent and that said Letters Patent is hereby corrected as shown below:

Column 3,
Line 67, after "inductors" add "30"

Column 4,
Line 25, change "8" to "22"

Column 6,
Line 46, change "10" to "1"
Line 50, change "118" to "122"

Column 7,
Line 25, change "as" to "at"

Signed and Sealed this

Sixteenth Day of October, 2001

*Attest:*

*Attesting Officer*

NICHOLAS P. GODICI
*Acting Director of the United States Patent and Trademark Office*